(12) United States Patent
Childs et al.

(10) Patent No.: US 10,103,720 B2
(45) Date of Patent: Oct. 16, 2018

(54) METHOD AND APPARATUS FOR A BUCK CONVERTER WITH PULSE WIDTH MODULATION AND PULSE FREQUENCY MODULATION MODE

(71) Applicant: Dialog Semiconductor (UK) Limited, Reading (GB)

(72) Inventors: Mark Childs, Swindon (GB); Jindrich Svorc, Swindon (GB)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/516,820

(22) Filed: Oct. 17, 2014

(65) Prior Publication Data

US 2016/0105108 A1 Apr. 14, 2016

(30) Foreign Application Priority Data

Oct. 14, 2014 (EP) ..................................... 14188907

(51) Int. Cl.
*H03K 7/00* (2006.01)
*H03K 7/06* (2006.01)
*H02M 3/158* (2006.01)
*H02M 1/00* (2006.01)

(52) U.S. Cl.
CPC ............ *H03K 7/06* (2013.01); *H02M 3/1588* (2013.01); *H02M 2001/0032* (2013.01); *Y02B 70/1466* (2013.01); *Y02B 70/16* (2013.01)

(58) Field of Classification Search
CPC .... H03F 3/217; H03F 1/523; H03F 2200/351; H03K 7/08; H03K 4/50; H03K 4/502; H03K 7/10
See application file for complete search history.

(56) References Cited

U.S. PATENT DOCUMENTS 8,106,642 B2   1/2012  Chen et al.
8,164,218 B2*  4/2012  Kuang .................. H02M 3/158
                                                    307/43
8,362,756 B2   1/2013  Weinstein et al.
(Continued)

OTHER PUBLICATIONS

European Search Report 14188901.1-1904, dated Mar. 27, 2015, Dialog Semiconductor (UK) Ltd.
(Continued)

*Primary Examiner* — Adolf Berhane
*Assistant Examiner* — Henry Lee, III
(74) *Attorney, Agent, or Firm* — Saile Ackerman LLC; Stephen B. Ackerman

(57) ABSTRACT

A buck converter device with minimum off-time operation, the device comprising a comparator providing an output signal of a minimum off time, a first amplifier, a p-channel MOSFET whose gate is connected to the output of a first amplifier providing a signal threshold voltage to a positive terminal of a comparator, a second amplifier, and, a second p-channel MOSFET whose gate is connected to the output of a second amplifier providing a signal to a negative terminal of a comparator, and a capacitor element. A capacitor establishes a voltage whose rate of change is proportional to power supply Vdd, establishing a time to charge the capacitor to a threshold voltage proportional to (Vdd−Vref)/Vdd, and establishing a minimum off time on the output of a comparator.

16 Claims, 5 Drawing Sheets

(56) References Cited

U.S. PATENT DOCUMENTS

| | | |
|---|---|---|
| 8,525,502 B2 | 9/2013 | Weinstein et al. |
| 2004/0037094 A1* | 2/2004 | Muegge ............... H02M 3/156 |
| | | 363/21.16 |
| 2008/0024104 A1 | 1/2008 | Yamada |
| 2009/0295458 A1* | 12/2009 | Kameyama ............ G05F 3/227 |
| | | 327/512 |
| 2011/0241641 A1 | 10/2011 | Chen et al. |
| 2012/0081094 A1* | 4/2012 | Luo ...................... H02M 3/156 |
| | | 323/284 |
| 2012/0249106 A1* | 10/2012 | Wu ...................... H02M 3/156 |
| | | 323/288 |
| 2012/0286827 A1* | 11/2012 | Yamada ................. H03F 1/301 |
| | | 327/103 |
| 2012/0319604 A1 | 12/2012 | Waiters |
| 2014/0232367 A1 | 8/2014 | Kuo et al. |

OTHER PUBLICATIONS

"A High Efficiency DC/DC Boost Regulator with Adaptive Off/On-Time Control," by Chen-Yu Wang et al., VLSI Design, Automation, and Test (VLSI-DAT), 2013 International Symposium on IEEE, Apr. 22, 2013, pp. 1-4.

KR 2010 0102824 A (IUCF HYU [KR]) Sep. 27, 2010, "Adaptive On-Time Controller and Pulse Frequency Modulation Buck Converter Using the Same," by Hyunseok Nam et al, Jun. 9, 2011, pp. 1-15.

* cited by examiner

METHOD AND APPARATUS FOR A BUCK CONVERTER WITH PULSE WIDTH MODULATION AND PULSE FREQUENCY MODULATION MODE

BACKGROUND

Field

The disclosure relates generally to power supply circuits and methods and, more particularly, to buck type converters, circuit and a method thereof.

Description of the Related Art

DC-DC converters are voltage regulators used in conjunction with semiconductor devices, integrated circuit (IC), battery chargers, and other applications. DC-DC converters can be used in digital, analog, and power applications to deliver a regulated supply voltage.

An example of known to the inventor, DC-DC converter's regulator output stage is shown in FIG. 1. FIG. 1 illustrates a typical implementation of a buck DC/DC output stage supplying a resistive load. The circuit comprises of a voltage source VDD 10, and output voltage VOUT 20, a p-channel MOSFET switch 30, a n-channel MOSFET switch 40. An inductor element 50 is electrically couples the switch network (p-channel MOSFET switch 30 and a n-channel MOSFET switch 40) and the output load (e.g. the output load consists of a d capacitor 60 and resistive load 70). A buck converter generates a pulse width modulation (PWM) switching voltage at the LX node, denoted as VLX. This voltage is filtered, with high efficiency, by an inductor (L) 50, and an output capacitor (C) 60. Buck converters operate in one of two modes, the pulse width modulation (PWM) mode, and the pulse frequency modulation (PFM) mode. In the pulse width modulation (PWM) mode, the frequency of operation is fixed. In the pulse frequency modulation (PFM) mode, the frequency is allowed to change with the load current.

As illustrated in FIG. 2, the p-channel MOSFET switch voltage and inductor coil current are shown as a function of time is denoted. The p-channel MOSFET switch voltage as a function of time 74 highlights the voltage state during the on-time, off-time and period. The inductor coil current as a function of time 76 also shows the current magnitude during the different states of the circuit. In both modes of operation, the inductor coil current (IL) increases during the on-time (Ton) when the p-channel MOSFET switch 30 is "on" state and the LX node is "high." During the off-time (Toff), the p-channel MOSFET switch 30 turns "off" state and the n-channel MOSFET switch 40 turns into an "on" state. During this state, the LX node goes to a "low state," and the inductor coil current (IL) decreases. The length of the operational cycle is the period, Tperiod, of the switching cycle that is the sum of the on-time (Ton), and the off-time (Toff). The frequency is related to the period, Tperiod.

Pulse frequency modulation (PFM) mode can be used to make a buck converter with superb operating characteristics. A buck converter in pulse frequency modulation (PFM) mode is stable with a variety of operating conditions and loads (e.g. output capacitor, output inductors, frequency, etc.). Additionally, the pulse frequency modulation (PFM) mode typically offers very low quiescent current, in comparison with a current-loop PWM mode buck converter. The pulse frequency modulation (PFM) mode naturally scales the frequency of the buck converter with load offering efficiency benefits at low and medium loads. However, PFM mode is not usually favored amongst system designers, as the noise created by the buck converter does not have a fixed frequency. This can cause issues with interference because the frequency is unpredictable. In pulse frequency modulation (PFM) architecture, the buck converter operates in PFM mode at low loads with a fixed current limit. As the load increases the current in the coil moves from discontinuous conduction mode (DCM) to continuous conduction mode (CCM). The frequency of the buck converter in this condition is set by the fixed minimum off-time. Once the load approaches the fixed current limit, the current limit is allowed to rise dynamically to support the load. The frequency is still set by the difference in the input and output voltages, and fixed minimum off-time.

A digital pulse frequency modulation controller for switch-mode power supply is described. As discussed in published U.S. Pat. No. 8,525,502 to Weinstein et al, describes digital logic using a pulse frequency mode which includes a frequency targeting mode which dynamically adjusts the size of the pulses in order to achieve a switching frequency within a desired band.

A digital boost feedback voltage controller for switch-mode power supply using pulse frequency modulation (PF) described. As discussed in published U.S. Pat. No. 8,362,756 to Weinstein et al, discloses a controller configured to send pulse frequency modulation (PFM) high and low side signals that control the voltage on the power stage output capacitor and charge pump output capacitor.

A cascade boost and inverting buck converter with independent control has been disclosed. As discussed in published U. S. Patent Application US 2012/03196604 to Walters describes a controller which may control the boost converter based on on-time control. In inverted buck converter, duty cycle is based on phase angle of the AC conductive angle modulated voltage.

A current mode buck converter with fixed PWM/PFM boundary is disclosed. As discussed in published U.S. Pat. No. 8,106,642 and U.S. Patent Application US2011/0241641 to Chen et al., describes a buck converter that operates in pulse width modulation (PWM) and pulse frequency modulation (PFM) mode which transitions from PWM to PFM mode by adaptively adjusting a trigger condition.

In these embodiments, the solutions to improve the response of a voltage converter in pulse frequency modulation (PFM) mode, and more specifically utilize various means to address transitioning from, PWM to PFM mode is discussed.

SUMMARY

It is desirable to provide a solution to that achieves a more predictable frequency for the buck converter in pulse frequency modulation (PFM) mode when the load current is high enough to create significant interference.

It is desirable to provide a solution for a buck converter which operates in a purely hysteretic mode.

It is desirable to provide a solution for a buck converter which operates in pulse frequency modulation (PFM) mode.

It is desirable to provide a solution for a buck converter which operates in a continuous conduction mode (CCM).

A principal object of the present disclosure is to provide a solution for a buck converter whose frequency becomes fixed by the minimum off-time at high loads.

Another further object of the present disclosure is to provide a solution for a buck converter whose minimum off-time is set by a circuit to fix the value of the frequency.

Also in accordance with the object of the present disclosure, an off-time circuit is provided that creates a minimum off-time proportional to (1−D) where D is the duty cycle.

The above and other objects are achieved by a buck converter device in pulse frequency modulation (PFM) mode to provide a more predictable frequency.

The above and other objects are further achieved by providing a buck converter having a pulse frequency modulation (PFM) mode where the frequency is fixed, where the fixed frequency is set using a minimum off-time, where the minimum off-time is proportional to 1−D where D is the duty cycle.

The above and other objects are further achieved by a buck converter device having a pulse frequency modulation (PFM) where the frequency is fixed, with minimum off-time operation, whose minimum off time is proportional to the 1−D, where D is the duty cycle, the device comprising a comparator providing an output signal of a minimum off time, an amplifier; and, a p-channel MOSFET whose gate is connected to the output of said amplifier providing a signal threshold voltage to a positive terminal of said comparator.

The above and other objects are further achieved by a method of pulse frequency modulation (PFM) with low loads, comprising the following steps: providing a buck converter having a PFM mode, operating said PFM mode with a fixed frequency, wherein the fixed frequency is set using a minimum off-time, and setting the minimum off-time to be proportional to (1−D), where D is a duty cycle of the buck converter.

The above and other objects are further achieved by a method of pulse frequency modulation (PFM) with low loads comprising of the following steps: (1) providing a buck converter comprising of an amplifier, a comparator, a p-channel MOSFET, a first resistor element, a second resistor element, a third resistor element, a capacitor element, a first switch, and a second switch, (2) creating a replica of reference voltage Vref proportional to the difference between Vdd and Vref, (3) creating a threshold voltage above ground proportional to the difference between Vdd and Vref, (4) establishing a voltage on a capacitor whose rate of change is proportional to power supply Vdd, (5) establishing a time to charge a capacitor to a threshold voltage proportional to (Vdd−Vref)/Vdd, and (6) establishing a minimum off time on the output of a comparator.

As such, a novel buck converter with improved pulse frequency modulation (PFM) mode of operation where the frequency is fixed is desired. Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

Figure 1:
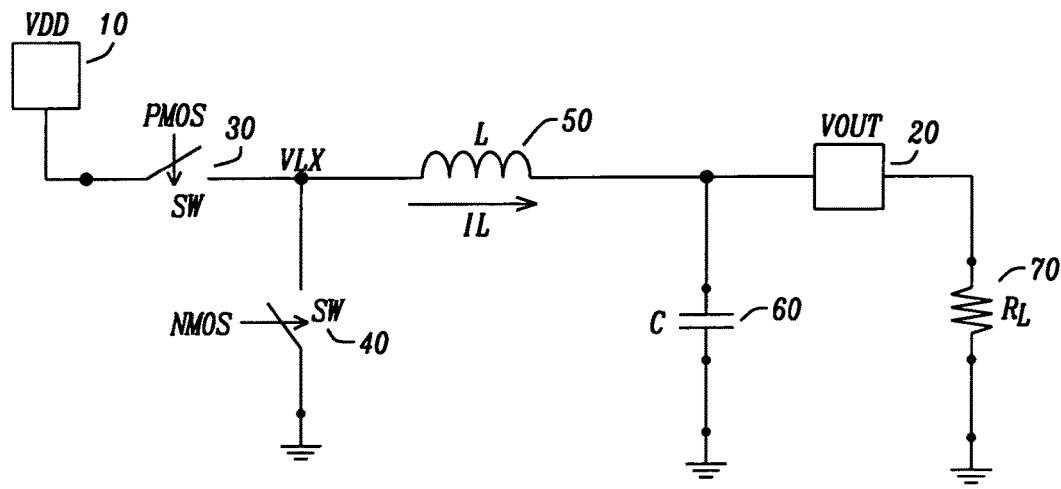
FIG. 1 prior art is a circuit schematic diagram illustrating an embodiment known to the inventor of a buck converter and load.

FIG. 1 illustrates a typical implementation of a buck DC/DC output stage supplying a resistive load. The circuit comprises of a voltage source VDD 10, and output voltage VOUT 20, a p-channel MOSFET switch 30, a n-channel MOSFET switch 40. An inductor element 50 is electrically couples the switch network (p-channel MOSFET switch 30 and a n-channel MOSFET switch 40) and the output load (e.g. the output load consists of a capacitor 60 and resistive load 70). A buck converter generates a pulse width modulation (PWM) switching voltage at the LX node, denoted as VLX. This voltage is filtered, with high efficiency, by an inductor (L) 50, and an output capacitor (C) 60. Buck converters operate in one of two modes, the pulse width modulation (PWM) mode, and the pulse frequency modulation (PFM) mode. In the pulse width modulation (PWM) mode, the frequency of operation is fixed. In the pulse frequency modulation (PFM) mode, the frequency is allowed to change with the load current.

Figure 2:
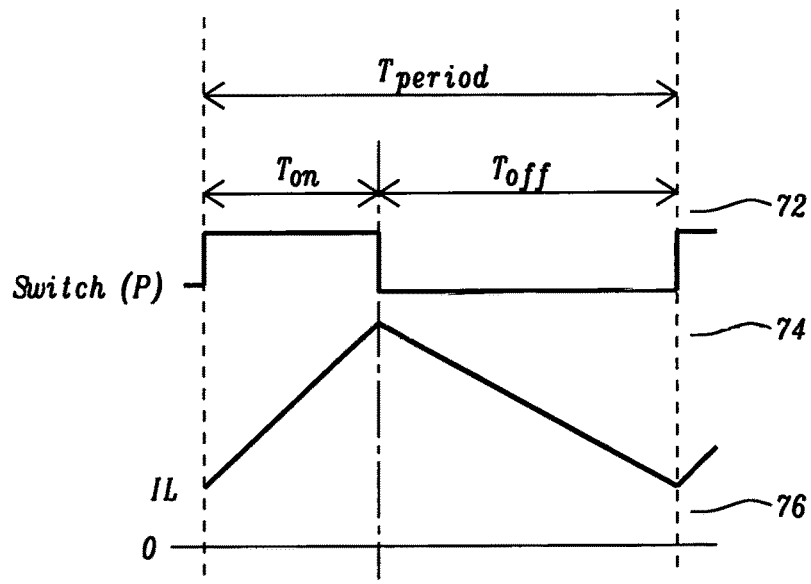
FIG. 2 prior art is a plot of p-channel MOSFET switch voltage and coil current as a function of time known to the inventor.

As illustrated in FIG. 2, the p-channel MOSFET switch voltage and inductor coil current are shown as a function of time is denoted as 80. The p-channel MOSFET switch voltage as a function of time 74 highlights the voltage state during the on-time, off-time and period. The inductor coil current as a function of time 76 also shows the current magnitude during the different states of the circuit. In both modes of operation, the inductor coil current (IL) increases during the on-time (Ton) when the p-channel MOSFET switch 30 is "on" state and the LX node is "high." During the off-time (Toff), the p-channel MOSFET switch 30 turns "off" state and the n-channel MOSFET switch 40 turns into an "on" state. During this state, the LX node goes to a "low state," and the inductor coil current (IL) decreases. The length of the operational cycle is the period, Tperiod, of the switching cycle that is the sum of the on-time (Ton), and the off-time (Toff). The frequency is related to the period, Tperiod.

Figure 3A:
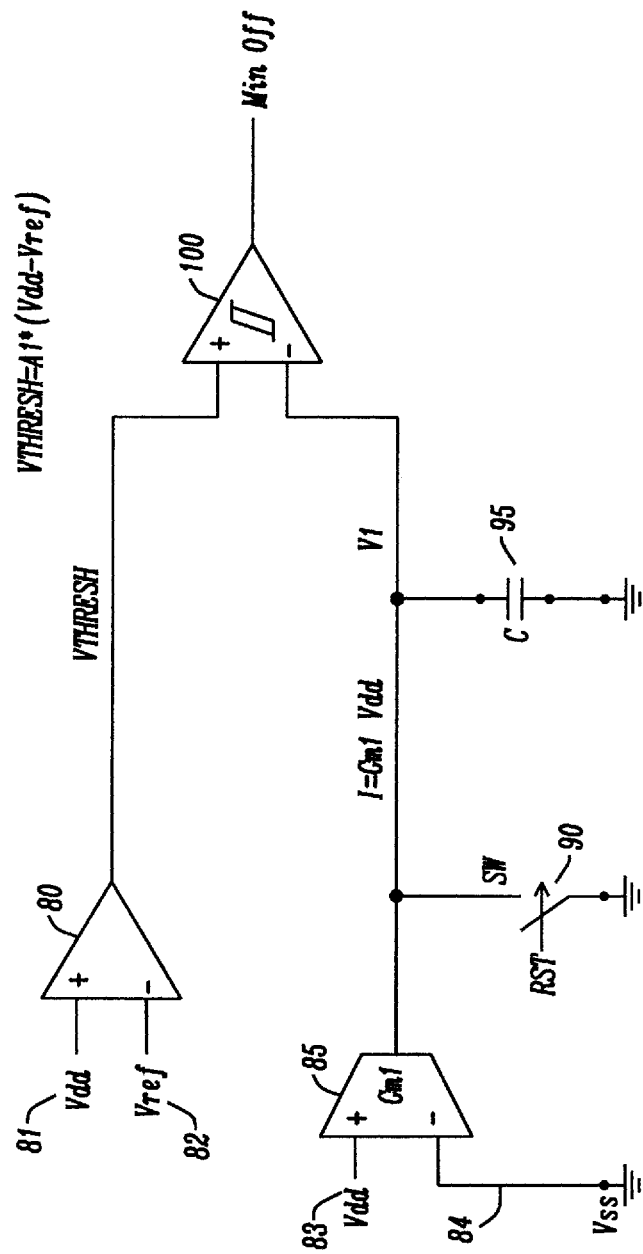
FIG. 3A is a circuit schematic diagram in accordance with a first embodiment of the disclosure.

The buck converter may operate in pure PFM with low loads. In this mode the buck converter operates as follows; (1) When the output voltage falls below the reference voltage the output PMOS turns on; (2) When the current in the coil reaches the fixed current limit the output PMOS turns off and the output NMOS turns on; (3) If the NMOS current reaches zero, before the output voltage falls below the reference voltage again, both pass-devices are turned off and the output is high impedance; (4) When the load current approaches the fixed current limit the buck moves to "dynamic sleep". In this mode the current limit is varied with the drop in output voltage of the buck. When the buck is operating in this mode the frequency is fixed by the minimum off-time. In this case the buck operates as follows: (A) The output voltage is always below the DAC voltage, so the PMOS turns on immediately; (B) The current rises until it reaches the dynamically controlled current limit; (C) The NMOS turns on, and the minimum off-time counter is started: (D) Once the minimum off-time counter completes the PMOS turns back on The duty cycle of the buck is still such that Ton=Tperiod* (D) and Toff=Tperiod*(1−D) where D is the duty cycle, D=(vout/Vdd). If the output voltage (vout) and the supply (Vdd) are fixed, the frequency is therefore controlled by the minimum off-time. If the minimum off time is controlled so that Toff=K(1−D) where K is a constant then the frequency is fixed (again D=Vout/Vdd). To explain what happens here consider the case where supply rises and the min off-time is fixed. As the supply rises so the rate of change of current in the coil during the NMOS on-time increases. The minimum current in the coil (below the current limit) therefore falls. The rate of change of current in the coil for the PMOS on-time has not changed, so the PMOS on time must be longer. This causes the frequency to fall. With the variable min-off time as given above the effect is countered. Now, as supply rises the min off-time decreased, and so the frequency remains the same. By expanding the equation a practical circuit can be found. Toff=K·(Vdd−Vout)/Vdd FIG. 3A illustrates a circuit schematic of the first embodiment in this disclosure. An amplifier A1 80 has two inputs Vdd 81 and voltage reference Vref 82. The output of amplifier A1 80 value is the VTHRESH, where is VTHRESH=A1*(Vdd−Vref). A MUX 85 has two input signals Vdd and ground Vss 85, providing gain Gm1. A current of magnitude I=Gm1 Vdd, for voltage V1. A switch RST 90 is a switch to ground. This is followed by a capacitor C 95 providing voltage V1. The two signals VTHRESH and V1 are inputs to comparator COMP1 100 providing an output signal Min Off.

Figure 3B:
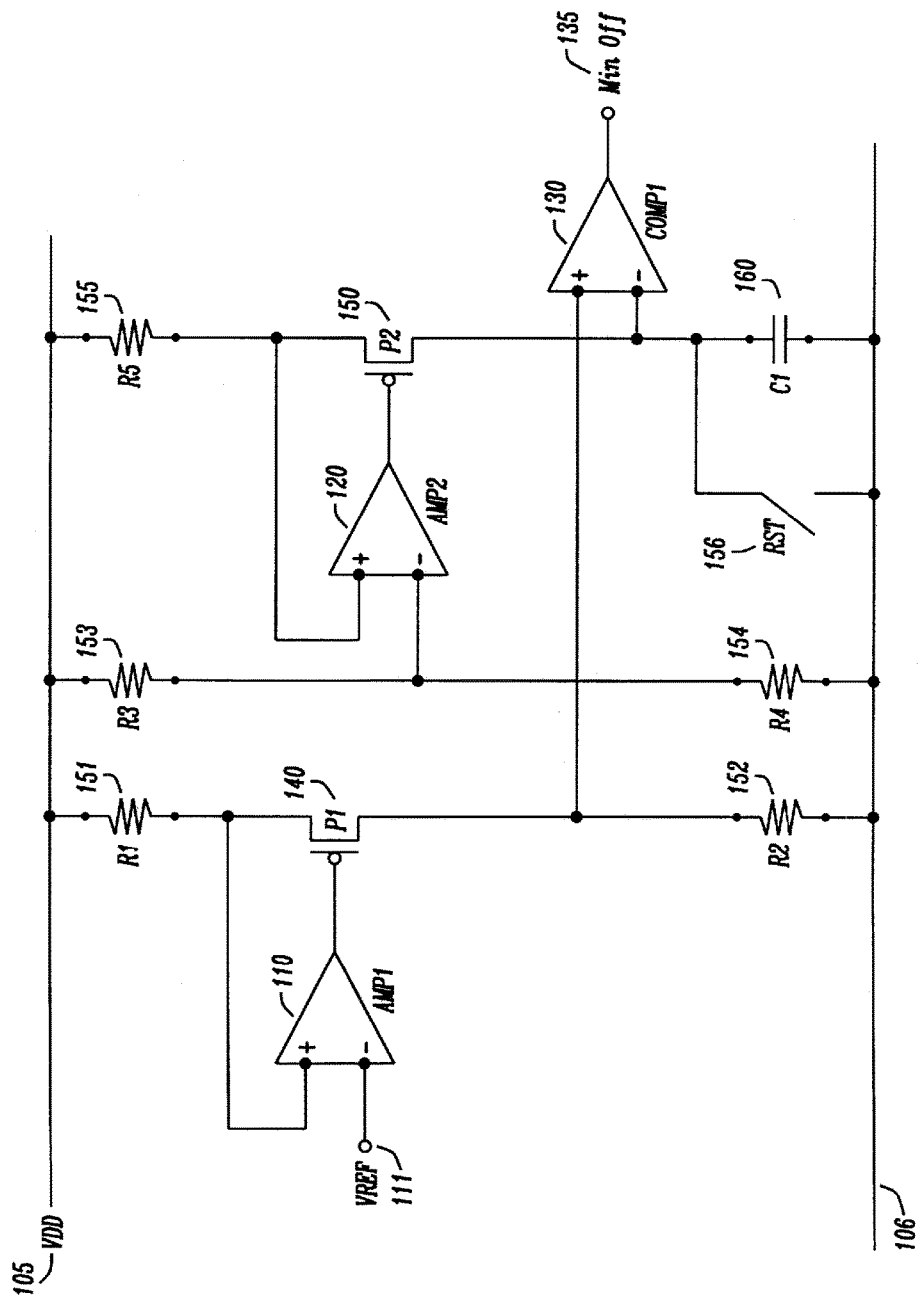
FIG. 3B is a circuit schematic diagram in accordance with a second embodiment of the disclosure.

FIG. 3B illustrates a circuit schematic of the second embodiment in this disclosure. A second embodiment is to charge a capacitor with a current proportional to Vdd. If the circuit is arranged such that the capacitor must charge up to a voltage proportional to (Vdd−Vout) then the time taken will be proportional to the value required to remove the duty-cycle effect on the frequency of the buck. The buck converter will then operate with a fixed frequency when in continuous current mode operation. FIG. 3B creates a fixed current into the capacitor. The circuit implementation has a power supply Vdd 105. A first differential amplifier 110 has a negative input connected to input reference signal Vref. The first differential amplifier 110 has an output signal connected to a gate of a p-channel MOSFET 140. The first differential amplifier 110 positive input is electrically connected to the source of the p-channel MOSFET P1 140. The p-channel MOSFET P1 140 source is connected to a resistor element R1 151 and p-channel MOSFET 140 drain is connected to a resistor element R2 152. A second differential amplifier 120 has a negative input connected to a resistor divider resistor element R3 153 and resistor element R4 154. The second differential amplifier 120 has an output signal connected to a gate of p-channel MOSFET P2 150. The second differential amplifier 120 positive input is electrically connected to the source of the p-channel MOSFET 150. The p-channel MOSFET 140 source is connected to a resistor element R5 155 and p-channel MOSFET 150 drain is connected to a switch RST 156, and capacitor element C1 160. A comparator COMP1 130 has two inputs where the first positive input is connected to the p-channel MOSFET P1 drain 140, and a second negative input connected to the p-channel MOSFET P2 drain 150. The output of the comparator COMP1 130 is the "Min-off" signal 135.

In the circuit above the operation is as follows:

The amplifier AMP1 creates a replica of Vref at the bottom of R1. The current through R1 is therefore proportional to the difference between Vdd and Vref. This is the (Vdd−Vref) term in the equation.

This current is passed through R2, creating a threshold voltage (Vthresh) above ground proportional to Vdd−Vref. The resistors R3 and R4 create a voltage proportional to Vdd.

The amplifier AMP2 creates a replica of this voltage across R5 equal to that across R3. The current through R5 is therefore proportional to the supply voltage Vdd.

The rate of change of the voltage across C1 is therefore proportional also to Vdd.

The time taken for the capacitor C1 to charge to Vthresh is therefore proportional to:

(Vdd−Vref)/Vdd which re-arranges to (1−D) The switch (rst) resets the circuit at the start of the on-time so that the circuit is ready to start again at the next off-time.

Figure 4:
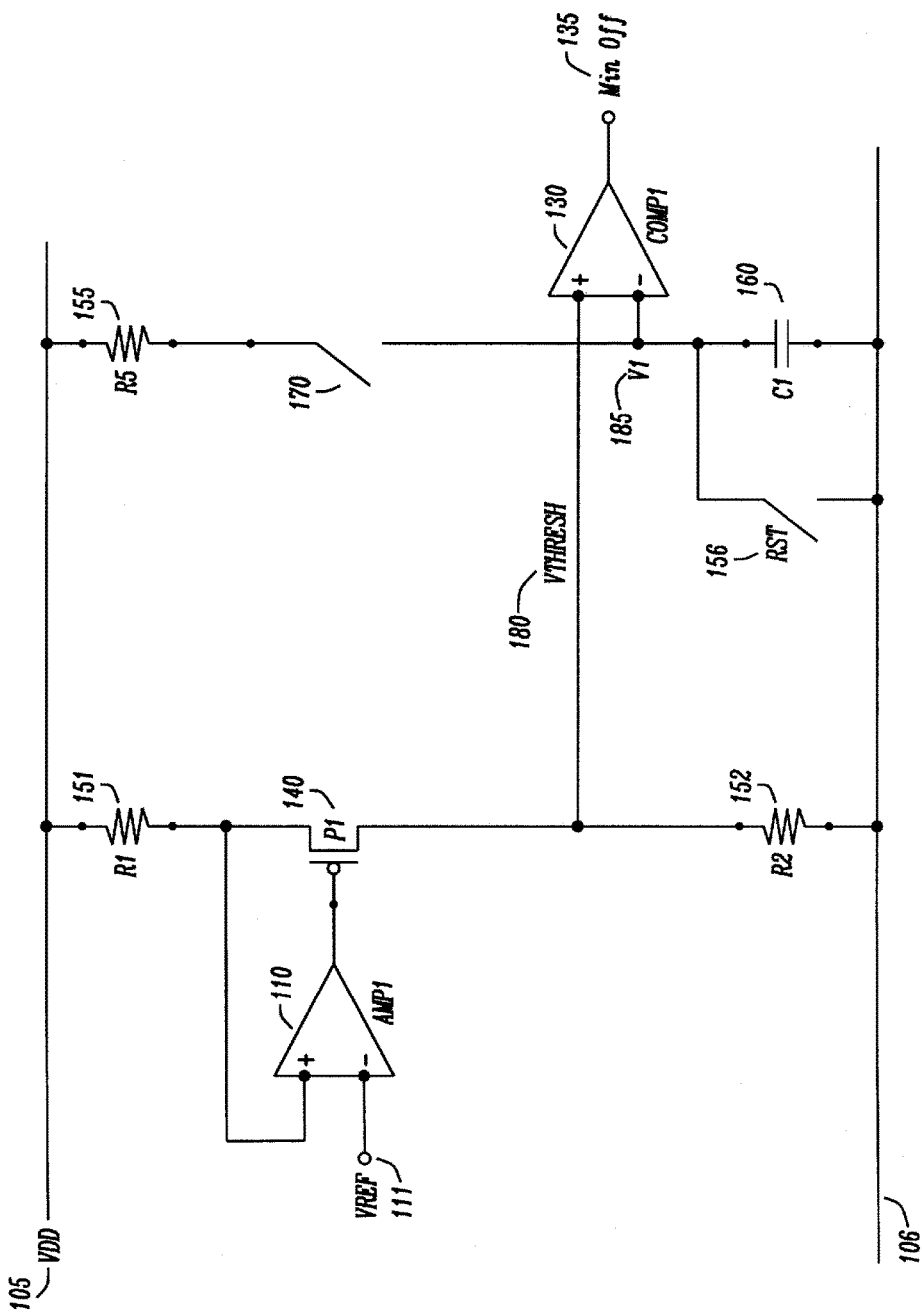
FIG. 4 is a circuit schematic diagram in accordance with a third embodiment of the disclosure.

FIG. 4 is a circuit schematic diagram illustrating a circuit schematic in accordance with the third embodiment of the disclosure. The circuit as illustrated in FIG. 4 uses a resistor rather than a current source to reduce the quiescent current the block requires. The circuit below is similar to the first embodiment, but somewhat simpler. The current into the capacitor is no longer constant, but is still directly proportional to the supply. The initial slope of the voltage waveform on V1 will be approximately linear and proportional to the supply. Therefore if the threshold voltage is relatively low the circuit will approximate the first implementation. If the threshold is higher the voltage is no longer linear, but is still proportional to supply. In any practical implementation this circuit is sufficient to give a good fixed frequency operation.

The circuit implementation has a power supply Vdd 105. A first differential amplifier 110 has a negative input connected to input signal reference voltage Vref. The first differential amplifier 110 has an output signal connected to a gate of a p-channel MOSFET 140. The first differential amplifier 110 positive input is electrically connected to the source of the p-channel MOSFET P1 140. The p-channel MOSFET P1 140 source is connected to a resistor element R1 151 and p-channel MOSFET 140 drain is connected to a resistor element R2 152. A comparator COMP1 130 has two inputs where the first positive input is connected to the p-channel MOSFET P1 drain 140, and a second negative input connected to a switch RST 156, and capacitor element C1 160. A second switch 170 is in series with the resistor 155. The output of comparator COMP1 130 is the "Min-off" signal 135.

This invention fixes the frequency of the buck in PFM making the effect of the interference much easier to prevent in a practical design. The fixed frequency also offers other benefits in multi-phase bucks. Specifically it allows the use of a fixed delay between phases to create equally spaced phase delays. This radically simplifies the creation of multi-phase PFM bucks.

The circuit in the second embodiment was designed and simulated with a full switching model of the PFM buck with dynamic sleep current. The table, Table 1, below shows the results obtained from the second embodiment.

TABLE 1

| Vin | Vout | Freq1 | Freq2 |
|---|---|---|---|
| 4.7 | 0.6 | 2.41 | 2.08 |
| 4 | 0.6 | 2.34 | 2.06 |
| 3.2 | 0.6 | 2.24 | 2.05 |
| 4.7 | 1 | 2.17 | 2.08 |
| 4 | 1 | 2.07 | 2.07 |
| 3.2 | 1 | 1.90 | 2.04 |
| 4.7 | 1.4 | 1.94 | 2.08 |
| 4 | 1.4 | 1.79 | 2.06 |
| 3.2 | 1.4 | 1.55 | 2.01 |
|  | Tol. | 23% | 1.68% |

The first two columns show the supply and output voltage. As these change so the duty cycle will change. As the duty cycle changes if the minimum off-time is fixed the frequency will shift. The expected frequency for a fixed minimum off-time implementation is given in the third column. The fourth column shows the results when using the circuit as shown. The tolerance is given at the bottom. The frequency of the fixed minimum off-time circuit is 2.07 MHz+/−23%. The frequency of the proposed circuit is 2.07 MHz+/−1.68%. This accuracy is more than adequate to create a multi-phase buck converter using just a simple delay circuit to offset each phase.

The same effect is created in a digital or semi-digital way. For example, if the supply current were measured using an analog-to-digital converter, ADC, and if the minimum off-time were digitally programmable. In this case the digital would calculate the "correct" minimum off-time for the supply and output voltage conditions to give fixed frequency operation. This embodiment, can be applied to any combination of purely analog, purely digital or mixed-mode applications. Equally, the scheme should be suitable for most switching architectures that use a continuous-current mode of operation, and specifically should cover boost converters, as well as buck converters.

Figure 5:
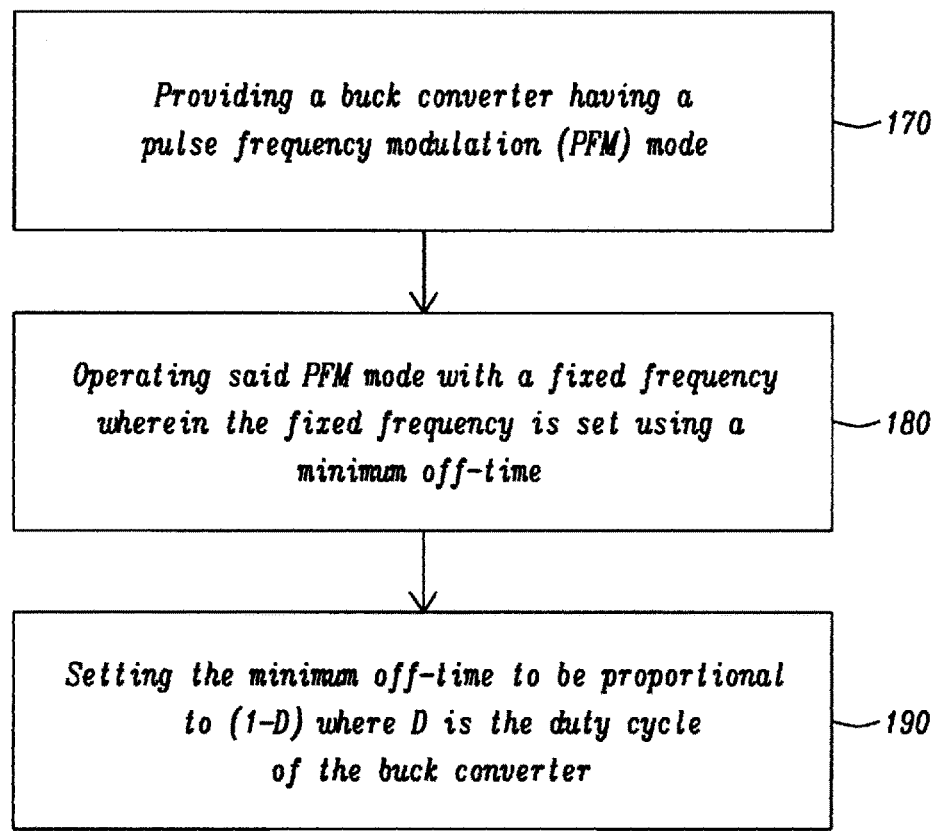
FIG. 5 a methodology for providing an improved buck converter in pulse frequency modulation (PFM) mode in accordance with an embodiment of the disclosure.

FIG. 5 a methodology for providing an improved buck converter in pulse frequency modulation (PFM) mode in accordance with an embodiment of the disclosure. A method of pulse frequency modulation (PFM) with low loads comprises the steps: a first step 170 providing a buck converter having a pulse frequency modulation (PFM) mode, a second step 180 operating the PFM mode with a fixed frequency where the fixed frequency is set using a minimum off-time, a third step 190 setting the minimum off-time to be proportional to (1−D), where D is the duty cycle of the buck converter.

As such, a novel buck converter with fixed frequency operation and minimum off-time are herein described. Other advantages will be recognized by those of ordinary skill in the art.

The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A buck converter device having a pulse frequency modulation (PFM) wherein a frequency is fixed using a minimum off-time operation, wherein a minimum off time is proportional to 1−D, wherein D is a duty cycle, wherein the buck converter device is configured to create a threshold voltage above ground proportional to a difference between a power supply voltage Vdd and a reference voltage Vref, comprising:
    a comparator providing an output signal of the minimum off time;
    a first amplifier;
    a p-channel MOSFET whose gate is connected to an output of said first amplifier providing the threshold voltage to a positive terminal of said comparator;
    a second amplifier; and,
    a second p-channel MOSFET whose gate is connected to an output of said second amplifier providing a signal to a negative terminal of said comparator.

2. The buck converter of claim 1, wherein a negative input terminal of said first amplifier is the reference voltage Vref.

3. The buck converter of claim 2, wherein a positive input of said first amplifier is electrically connected to a first resistor and said first p-channel MOSFET source.

4. The buck converter of claim 3, wherein said first p-channel MOSFET drain is electrically connected to a second resistor element and provides a positive threshold voltage input to said comparator whose threshold voltage is proportional to the difference between a power supply voltage Vdd and the reference voltage Vref.

5. The buck converter of claim 4, wherein said second amplifier negative input is electrically connected to a resistor divider network further comprising a third resistor and a fourth resistor providing a voltage to said negative input proportional to the power supply voltage.

6. The buck converter of claim 5, wherein said comparator negative input is electrically connected to a switch providing a start of an on-time to allow for re-initiation at a next off-time.

7. The buck converter of claim 6, wherein said comparator negative input is electrically connected to a capacitor providing a rate of change across a capacitor is proportional to the power supply voltage Vdd.

8. The buck converter of claim 7, wherein said capacitor is charged to the threshold voltage is a time proportional to (Vdd−Vref)/Vdd.

9. A buck converter device having a pulse frequency modulation (PFM) where a frequency is fixed, with minimum off-time operation, whose minimum off time is proportional to the 1−D, where D is the duty cycle, the buck converter device comprising:
    a comparator providing an output signal of the minimum off time;
    an amplifier, wherein a negative input terminal of said amplifier is the reference voltage Vref and a positive input of said amplifier is electrically connected to a first resistor and to a source of a first p-channel MOSFET; and
    said p-channel MOSFET whose gate is connected to an output of said amplifier providing a threshold voltage above ground proportional to a difference between a power supply voltage Vdd and a reference voltage Vref to a positive terminal of said comparator and wherein a drain of said first p-channel MOSFET is electrically connected to a second resistor element and providing a positive threshold voltage input to said comparator whose threshold voltage is proportional to a difference between the power supply voltage Vdd and the reference voltage Vref.

10. The buck converter of claim 9, wherein said comparator negative input is electrically connected to a switch providing a start of an on-time to allow for re-initiation at a next off-time.

11. The buck converter of claim 10, wherein said comparator negative input is electrically connected to a capacitor of voltage V1 providing a rate of change across the capacitor is linear and proportional to the power supply voltage Vdd.

12. The buck converter of claim 11, wherein said comparator negative input is electrically connected to a series combination of a resistor and a switch.

13. The buck converter of claim 12, wherein said converter provides a fixed frequency operation.

14. A method of pulse frequency modulation (PFM) with low loads, comprising steps:
provideing a buck converter having a PFM mode comprising a first amplifier, a second amplifier, a comparator, a first p-channel MOSFET, a second p-channel MOSFET (PMOS), a first resistor element, a second resistor element, a third resistor element, a fourth resistor element, a capacitor element, and a switch;
creating a replica of the reference voltage Vref proportional to the difference between the power supply voltage Vdd and the reference voltage Vref;
creating a threshold voltage above ground proportional to the difference between Vdd and Vref;
establishing a voltage from said third resistor and said fourth resistor proportional to power supply Vdd on said second amplifier;
creating a replica of voltage on said fifth resistor equal to voltage across said third resistor proportional to the supply voltage Vdd;
establishing a voltage on said capacitor whose rate of change is proportional to power supply Vdd;
establishing a time to charge the capacitor to a threshold voltage proportional to (Vdd−Vref)/Vdd; and
establishing a minimum off-time on an output of said comparator;
operating said PFM mode with a fixed frequency, wherein the fixed frequency is set using a minimum off-time; and
setting the minimum off time to be proportional to (1−D), where D is a duty cycle of the buck converter;
wherein the buck converter is configured to create a threshold voltage above ground proportional to a difference between a power supply voltage Vdd and a reference voltage Vref.

15. The method of pulse frequency modulation (PFM) of claim 14 further comprising the step:
resetting the switch at a start time of an on-time.

16. A method of pulse frequency modulation (PFM) with low loads comprising of the following steps:
providing a buck converter comprising of an amplifier, a comparator, a p-channel MOSFET, a first resistor element, a second resistor element, a third resistor element, a capacitor element, a first switch, and a second switch;
creating a replica of a reference voltage Vref proportional to the difference between Vdd and Vref;
creating a threshold voltage above ground proportional to the difference between a power supply voltage Vdd and the reference voltage Vref;
establishing a voltage on said capacitor whose rate of change is proportional to power supply Vdd;
establishing a time to charge the capacitor to a threshold voltage proportional to (Vdd−Vref)/Vdd; and
establishing a minimum off time on an output of said comparator.

* * * * *